United States Patent [19]

Reisman et al.

[11] 4,351,805

[45] Sep. 28, 1982

[54] SINGLE GAS FLOW ELEVATED PRESSURE REACTOR

[75] Inventors: Arnold Reisman; Melvin Berkenblit, both of Yorktown Heights, N.Y.

[73] Assignee: International Business Machines Corporation, Armonk, N.Y.

[21] Appl. No.: 251,591

[22] Filed: Apr. 6, 1981

[51] Int. Cl.³ ............................................ F28D 21/00
[52] U.S. Cl. .............................. 422/202; 75/134 S; 75/134 P; 118/729; 118/733; 219/76.1; 219/385; 422/307; 432/205; 432/253
[58] Field of Search .............. 422/198, 199, 202, 307; 432/205, 253; 118/500, 724, 725, 727, 729, 733; 75/134 P, 134 S; 148/175, 186, 187, 189, 133; 13/31 R; 219/76.1, 385; 269/8

[56] References Cited

U.S. PATENT DOCUMENTS

| Re. 28,402 | 4/1975 | Aboaf et al. | 148/187 X |
|---|---|---|---|
| 3,112,919 | 12/1963 | Gunow | 432/205 X |
| 3,183,277 | 5/1965 | Scherer et al. | 422/202 X |
| 3,322,501 | 5/1967 | Woodall | 75/134 P X |
| 3,345,223 | 10/1967 | Reisman et al. | 148/175 |
| 3,354,004 | 11/1967 | Reisman et al. | 148/175 |
| 3,577,286 | 5/1971 | Berkenblit et al. | 148/175 |
| 3,662,708 | 5/1972 | Shrader | 269/8 X |
| 4,204,893 | 5/1980 | Cox | 148/175 |
| 4,235,841 | 11/1980 | Zimmerman | 422/199 X |

*Primary Examiner*—Richard L. Chiesa
*Attorney, Agent, or Firm*—John J. Goodwin

[57] ABSTRACT

An elevated pressure reactor apparatus for oxidizing or annealing specimens of the type including a reaction tube for containing the specimen surrounded by a heating furnace and enclosed in a pressure chamber, the apparatus incorporating a unique single gas flow feature, an improved multi-element furnace structure, a retrograde closure for the reaction tube to prevent gas flow back from the pressure chamber, a magnetically connected driving mechanism for a specimen support boat, and concentric gas entrance and exit tubes wherein exiting gas pre-heats the entering gas.

5 Claims, 3 Drawing Figures

SINGLE GAS FLOW ELEVATED PRESSURE REACTOR

TECHNICAL FIELD

The present invention relates to the field of apparatus used for the oxidation or annealing of specimens such as silicon semiconductor devices and the like under conditions of high pressure and temperature.

BACKGROUND ART

Apparatus for containing specimens such as silicon semiconductor devices and the like and performing oxidation thereof are commercially available and are referred to generically as High Pressure Reactors. High Pressure Reactors as known in the art consist of a chamber for containing the semiconductor device, sample, wafer, etc., and a suitable gas is introduced into the chamber at a high pressure. A "furnace" in the form of heating elements is provided proximate to the chamber to raise the temperature. The operation of the gas under high pressure and temperature results in the desired oxidation of the device.

Some examples of references that illustrate prior art combinations of quartz tubes and furnaces wherein gases react with semiconductor samples are U.S. Pat. No. 3,345,223 issued Oct. 3, 1967 to A. Reisman, et al. entitled "Epitaxial Deposition of Semiconductor Materials"; U.S. Pat. No. 3,354,004 issued Nov. 21, 1967 to A. Reisman, et al. entitled "Method for Enhancing Efficiency of Recovery of Semi-Conductor Material In Perturbal Disproportionation Systems"; U.S. Pat. No. 3,322,501 issued May 30, 1967 to J. M. Woodall entitled "Preparation of Gallium Arsenide With Controlled Silicon Concentrations"; U.S. Pat. No. Re. 28,402 issued Apr. 29, 1975 to J. A. Aboof et al. entitled "Method For Controlling Semiconductor Surface Potential"; U.S. Pat. No. 3,577,286 issued May 4, 1971 to M. Berkenblit et al. entitled "Semiconductor Preparation and Deposition". These references describe straightforward reaction tubes and furnaces and do not include the single gas flow, retrograde closure, improved furnace arrangement and other features of the present invention.

SUMMARY OF THE INVENTION

An object of the present invention is to provide an improved elevated pressure reactor having a single gas flow path which automatically provides an essentially uniform pressure everywhere in the system.

Another object of the present invention is to provide an improved elevated pressure reactor having a retrograde closure on a reaction tube within a pressure chamber to prevent gas in said pressure chamber from re-entering the reaction tube.

A further object of the present invention is to provide an elevated pressure reactor incorporating an improved heating furnace having two concentric heating elements.

Still another object of the present invention is to provide an improved elevated pressure reactor wherein gas exiting from the reactor is employed to pre-heat gas entering the reactor.

A still further object of the present invention is to provide an improved elevated pressure reactor having a magnetically coupled mechanism for moving a specimen within the reactor.

The foregoing and other objects, features and advantages of the invention will be apparent from the following more particular description of a preferred embodiment of the invention, as illustrated in the accompanying drawings.

DISCLOSURE OF THE INVENTION

Figure 1:
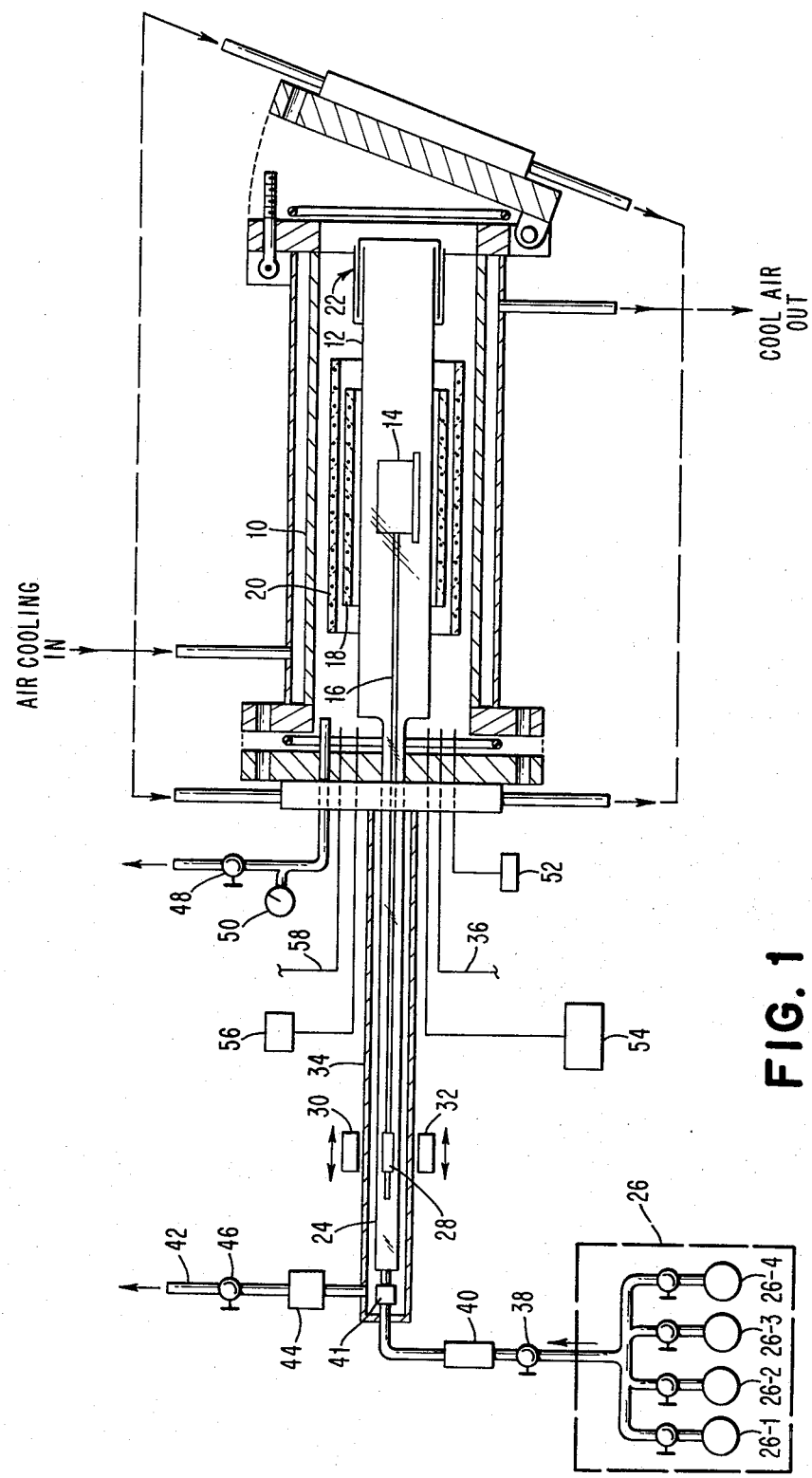
FIG. 1 is a schematic illustration of one embodiment of an elevated pressure reactor having a single gas flow according to the principles of the present invention.

Referring to FIG. 1, a schematic illustration of an elevated pressure reactor or oxidation system is shown including a pressure chamber 10, composed, for example, of steel, inside of which is located a reaction tube 12 which may be made of quartz. Inside of the reaction tube 12 is located a wafer boat 14 for containing the object or specimen to be oxidized, annealed, etc. Wafer boat 14 is connected to and can be moved by a rod 16.

Two separately controlled, concentrically arranged furnaces or heating elements 18 and 20 surround the reaction tube 12. Each of the furnaces 18 and 20 actually contain three heating elements, at the ends and in the center. One end of the pressure chamber 10 is provided with a hinged door to provide access to the wafer boat 14. One end of reaction tube 12 has a retrograde closure 22 for providing a high drift to diffusion velocity ratio of the gas exiting from the reaction tube for maintaining the pressure inside reaction tube 12 and inside pressure chamber 10 at the same value.

Retrograde closure 22 is shown in greater detail in FIG. 2 and will be more fully discussed hereinbelow. The other end of reaction tube 12 extends through the wall of pressure chamber 10 via elongated tube 24 and is connected to a source of gas 26. Gas source 26 is shown as a supply of pressured gas cylinders 26-1, 26-2, 26-3, and 26-4, however any suitable source of gas, such as a compressor could be used.

Rod 16, the one end of which is connected to wafer boat 14, also has a magnetic slug 28 fixed thereon. A pair of magnets 30 and 32 are located outside tube 24, as well as a surrounding tube 34 which is the gas exit tube for pressure chamber 10 which will be later described. Magnets 30 and 32 are connected to a motor, not shown, and can move toward the left or the right in the drawing. Magnetic slug 28, magnetically coupled to magnets 30 and 32 follows this left or right movement and, being connected to wafer boat 14 via rod 16, causes wafer boat 14 to move left or right within reaction tube 12 as desired by the operator who controls the magnet motor.

Two basic properties are involved in the apparatus of FIG. 1, temperature and pressure, and the instrumentalities related to both properties are unique features and will be discussed hereinbelow.

High temperatures within reaction tube 12, for example up to 1000 degrees centrigrade, are produced by furnaces 18 and 20 consisting of electrical heating elements connected to external furnace leads 36. It is known that heat loss or heat transfer becomes greater as pressure increases because of high convection. If only one furnace were employed, as in some conventional high pressure reactors, heat loss due to convections will occur because of the temperature difference between the furnace and the outer wall of the pressure chamber. This creates excessive temperature inhomogeneties and requires the use of excessive power. In the apparatus of FIG. 1, a second furnace 20 is provided around inner furnace 18 and is maintained at a slightly lower temperature so there is only a small temperature difference and therefore corresponding heat loss from furnace 18 radically. Also, a wall temperature control system is provided which surrounds the entire pressure chamber 10 and temperature controlled fluid such as air, as in FIG. 1, or liquid is passed over the pressure chamber 10. This air, or temperature control fluid is maintained at an elevated temperature, but which is lower than the temperature of the wall of the reactor chamber 12. Thus, if the temperature of the second furnace is in the range of 500 to 1000 degrees centigrade, the cooling fluid may be introduced at 300 degrees so that the temperature difference between the outer furnace 20 and the pressure chamber wall is not too large and heat loss due to convection between the outer furnace 20 and the pressure chamber wall is also reduced. Thus, heat loss from the reaction tube 12 is minimized.

In addition to the temperature efficient feature, the apparatus of FIG. 1 incorporates a unique pressure feature wherein a single gas flow technique is employed. More particularly, the gas pressure within quartz reaction tube 12 and the gas pressure within pressure chamber 10 is maintained at substantially the same pressure, which is controlled by a single source of gas pressure. Prior art systems include separate regulators for the pressure in the inner reaction tube and the outer pressure chamber. Since the pressure in the outer pressure chamber must not be less than the pressure in the inner reaction tube to prevent the reaction tube from rupturing, the use of two separate regulators in the prior art apparatus presents the possibility of destruction should the pressure regulator for the outer pressure chamber fail. This possibility is avoided with the single pressure gas flow feature of the present invention.

Referring to FIG. 1, gas from source 26 enters the system through a conventional valve 38 and filter 40 and connector 41. The gas is introduced through connector 41 directly into inner tube 24 and flows under pressure into reaction tube 12. The gas then flows out through retrograde closure 22 at the end of reaction tube 12 and into outer pressure chamber 10. Retrograde closure 22 is designed to permit the gas to flow from reaction tube 12 into pressure chamber 10, but does not permit any back flow or drift from pressure chamber 10 into reaction tube 12. The details of retrograde closure 22 will be later discussed more fully with reference to FIG. 2. The gas then flows from outer pressure chamber 10 through the left side of the FIG. 1 structure into tube 34 and out of the system via exit 42. It should be noted that as the gas exits in tube 34 it passes over the incoming gas in tube 24 and serves to pre-heat the incoming gas. The exit line path includes a conventional back pressure regulator 44 and variable leak 46 for adjustment purposes. Likewise, a conventional relief valve 48 and gauge 50 are provided for pressure chamber 10 as well as a fail-safe rupture disc 52. A conventional solenoid valve 54, controlled by pressure switch 56, is provided to operate a part to bleed pressure from the apparatus at the end of operation. Conventional thermocouple leads 58 are also provided to measure temperatures at various places within the apparatus.

Figure 2:
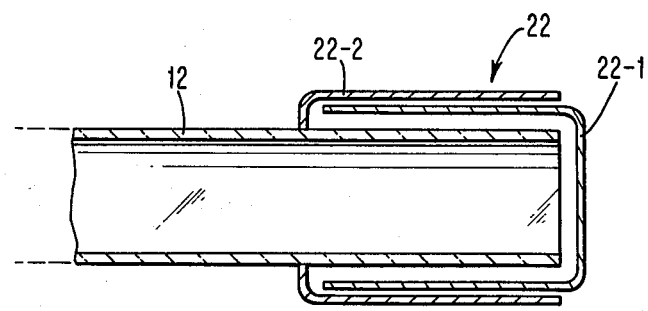
FIG. 2 is a schematic illustration of a unique loose fitting end cap for the apparatus of FIG. 1 which enables two portions of the apparatus to be maintained at the same pressure.

Referring to FIG. 2, a more detailed schematic illustration of retrograde closure 22 is shown including reaction tube 12, a cylindrical cap element 22-1 which is located at the open end of reaction tube 12 and extends back over the outer wall of reaction tube 12. A second cylindrical cap element 22-2 is fixed to the wall of reaction tube 12 and extends back over cap element 22-1.

In a typical structure, reaction tube 12 may have an inner diameter of 91 mm and an outer diameter of 96 mm. Cap element 22-1 may have an inner diameter of 103 mm and an outer diameter of 107 mm and cap element 22-2 may have an inner diameter of 108 mm and an outer diameter of 114 mm. Thus, the gas from reaction tube 12 flows through three decreasing cross-sectional areas of $$\pi 91^2/4 = 65 \text{ cm}^2;$$

$$\pi 103^2/4 - \pi 96^2/4 = 11 \text{ cm}^2; \text{ and}$$

$$\pi 108^2/4 - \pi 107^2/4 = 1.7 \text{ cm}^2.$$

Figure 3:
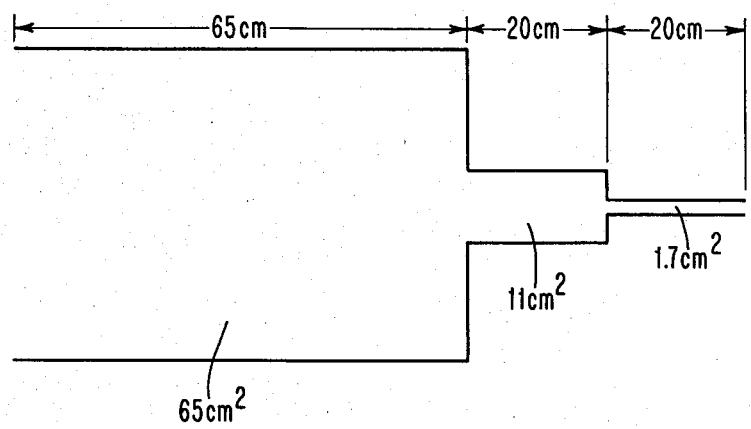
FIG. 3 is a representation drawing of the structure of FIG. 2.

With a typical linear overlap distance of the concentric elements of 20 cm., the structure of FIG. 2 can be illustrated as shown in FIG. 3.

The purpose of the retrograde closure 22 is to prevent any back drift of gas from pressure chamber 10 into reaction tube 12 since the gas in pressure chamber 10 becomes dirty due to the packing material in and around the furnaces 18 and 20, and the gas in reaction tube 12 must be of high purity.

In order to prevent such back drift and still be able to have a single gas flow system, the drift velocity $V_{DR}$ of the gas as it passes from reaction tube 12 into pressure chamber 10 must be greater than the diffusion velocity $V_D$ of the gas.

That such condition is met by the structure of the retrograde closure shown in FIGS. 2 and 3 can be established by reference to the following table of parameters. The calculations in the following table are provided for gas flow rates of 5 liters/min and 1 liter/min.

TABLE

| Flow Rate, F | 5 l/min | 1 l/min |
|---|---|---|
|  | 83 cm³/min | 17 cm³/min |
| Reaction Tube 12 area, (R) | 65 cm² | 65 cm² |
| Element 22-1, area, (I) | 11 cm² | 11 cm² |
| Element 22-2, area, (O) | 1.7 cm² | 1.7 cm² |
| Element 22-1, length, d | 20 cm | 20 cm |
| Element 22-2, length, d | 20 cm | 20 cm |
| Reaction tube closure, length, d' | 65 cm | 65 cm |
| Mean Gas Velocity, $\overline{C}$ | 4 × 10⁴ cm/sec | 4 × 10⁴ cm/sec |
| Mean Free Path, L | 1 × 10⁻⁵ cm | 1 × 10⁻⁵ cm |
| Diffusion Coeffic., D $D = \overline{C} L/2$ | 0.2 cm²/sec | 0.2 cm²/sec |
| Diffusion Velocity, $V_D$ |  |  |
| $V_D = \dfrac{D}{d}$ or $\dfrac{D}{d'}$ |  |  |
| Reaction tube 12 | 0.006 cm/sec | 0.006 cm/sec |
| Element 22-1 | 0.01 cm/sec | 0.01 cm/sec |
| Element 22-2 | 0.01 cm/sec | 0.01 cm/sec |
| Drift Velocity, $V_{DR}$ |  |  |
| $V_{DR} = \dfrac{F}{R}$ or $\dfrac{F}{I}$ or $\dfrac{F}{O}$ |  |  |
| Reaction tube 12 | 1.3 cm/sec | 0.26 cm/sec |
| Element 22-1 | 7.5 cm/sec | 1.6 cm/sec |
| Element 22-2 | 50 cm/sec | 10 cm/sec |

TABLE-continued

| | | | |
|---|---|---|---|
| $V_{DR}$ | Reaction tube 12 | 220/1 | 43/1 |
| $\overline{V_D}$ | Element 22-1 | 750/1 | 100/1 |
| | Element 22-2 | 5000/1 | 1000/1 |

It is seen therefore, that the incoming gas drift velocity $V_{DR}$ is much greater than the diffusion velocity $V_D$ and there is no back drift of impure gas from pressure chamber 10 into reaction tube 12 even though a single gas flow is employed and the pressures in the chamber and tube are essentially the same.

The retrograde closure of FIGS. 1 and 2 as shown, includes two elements 22-1 and 22-2, which form a serpentine shaped baffle for the path of the gas from reaction tube 12. It will be appreciated that, if necessary or desirable in other embodiments, additional elements such as 22-1 and 22-2 but with larger diameters may be concentrically mounted over element 22-2 to provide further stages of decreasing areas for the gas to travel through before reaching pressure chamber 10.

What has been described is a novel and unique high pressure reactor incorporating a single gas flow feature, an improved furnace structure, a magnetically connected mechanism for moving a wafer boat, a retrograde closure which prevents back drift from the pressure chamber to the reaction tube during the single gas flow, and concentric gas entrance and exit tubes wherein the exiting gas pre-heats the entering gas.

While the invention has been particularly shown and described with reference to the preferred embodiment thereof, it will be understood by those skilled in the art that the foregoing and other changes in form and details may be made therein without departing from the spirit and scope of the invention.

Having thus described my invention, what we claim as new, and desire to secure by Letters Patent is:

1. In a reactor apparatus for oxidizing or annealing specimens of the type including a reaction tube containing said specimen surrounded by a heating furnace and enclosed in a pressure chamber, the improvement consisting of;
    a single source of pressurized gas connected to one end of said reaction tube for providing gas to react with said specimen,
    and a retrograde closure mounted on the other end of said reaction tube to permit said gas to enter said surrounding pressure chamber and to prevent said gas in said pressure chamber from re-entering said reaction tube.

2. A reactor apparatus according to claim 1 wherein said retrograde closure includes at least first and second end cap elements, said first end cap element disposed over said other end and along a given length of said reaction tube with a first space between the exterior surface of said reaction tube and the interior surface of said first end cap, the cross-sectional area of said first space being smaller than the cross-sectional area of said end of said reaction tube,
    and said second end cap element having one end fixed to the exterior surface of said reaction tube and extending over the length of said first end cap element with a second space between the exterior surface of said first end cap element and the interior surface of said second end cap element, the cross-sectional area of said second space between said second and first end cap elements being smaller than said cross-sectional area of said first space between said first end cap element and said reaction tube.

3. A reactor apparatus according to claim 1 wherein said furnace includes a first heating structure surrounding said reaction tube and a second heating structure surrounding first heating structure, said second heating structure functioning to maintain the ambient temperature around said first heating element at an elevated value relative to the wall of said pressure chamber to reduce heat loss from said first heating element.

4. A reactor apparatus according to claim 1 further including a receptacle located within said reactor tube for supporting said specimen, a connecting member having one end coupled to said receptacle and extending out of one end of said reaction tube and surrounding pressure chamber, and means magnetically connected to the other end of said connecting member for moving said connecting member and said receptacle coupled thereto linearly within said reaction tube.

5. A reactor apparatus according to claim 1 wherein said source of pressurized gas is connected to said reaction tube by means of an entrance tube extending between said source of gas and through said pressure chamber to said one end of said reactor tube, and wherein said reactor apparatus further includes a gas exit tube extending from said pressure chamber concentrically around said entrance tube, said gas in said exit tube functioning to pre-heat said gas in said entrance tube.

* * * * *